(12) United States Patent
Mantell et al.

(10) Patent No.: US 11,235,382 B2
(45) Date of Patent: Feb. 1, 2022

(54) METHOD FOR SUPPORTING THREE DIMENSIONAL (3D) PRINTED FEATURES

(71) Applicants: XEROX CORPORATION, Norwalk, CT (US); Palo Alto Research Center Incorporated, Palo Alto, CA (US)

(72) Inventors: David A. Mantell, Rochester, NY (US); Daniel R. Cormier, Pittsford, NY (US); Christopher T. Chungbin, Webster, NY (US); Zachary S. Vader, East Amherst, NY (US); Viktor Sukhotskiy, Buffalo, NY (US); Scott J. Vader, Pittsford, NY (US); David Tilley, Williamson, NY (US)

(73) Assignees: XEROX CORPORATION, Norwalk, CT (US); PALO ALTO RESEARCH CENTER INCORPORATED, Palo Alto, CA (US)

( * ) Notice: Subject to any disclaimer, the term of this patent is extended or adjusted under 35 U.S.C. 154(b) by 80 days.

(21) Appl. No.: 16/666,212

(22) Filed: Oct. 28, 2019

(65) Prior Publication Data

US 2021/0121947 A1    Apr. 29, 2021

(51) Int. Cl.
  *B22D 23/00*    (2006.01)
  *B33Y 10/00*    (2015.01)
  *B29C 64/112*   (2017.01)

(52) U.S. Cl.
  CPC .......... *B22D 23/003* (2013.01); *B29C 64/112* (2017.08); *B33Y 10/00* (2014.12)

(58) Field of Classification Search
  CPC ....... B29C 64/40; B29C 64/112; B33Y 10/00; B22F 2003/1058
  See application file for complete search history.

(56) References Cited

U.S. PATENT DOCUMENTS

| 7,077,638 B2 * | 7/2006 | Leyden ................. B29C 64/112 |
| | | 425/174.4 |
| 7,685,694 B2 * | 3/2010 | Zagagi ................... B33Y 30/00 |
| | | 29/458 |
| 9,616,494 B2 | 4/2017 | Vader et al. |
| 10,040,119 B2 | 8/2018 | Vader |
| 10,576,689 B2 * | 3/2020 | Wighton .............. B29C 64/124 |

(Continued)

FOREIGN PATENT DOCUMENTS

| CN | 108857031 A | 11/2018 |
| EP | 2937206 A1 | 10/2015 |
| EP | 3181338 A1 | 6/2017 |

OTHER PUBLICATIONS

Sukhotskiy et al., "Magnetohydrodynamic Drop-on-Demand Liquid Metal 3D Printing," Solid Freeform Fabrication 2017: Proceedings of the 28th Annual International, Solid Freeform Fabrication Symposium—An Additive Manufacturing Conference, 1806-1811.

(Continued)

*Primary Examiner* — Jacob J Cigna
*Assistant Examiner* — Michael W Hotchkiss
(74) *Attorney, Agent, or Firm* — MH2 Technology Law Group LLP

(57) ABSTRACT

A method for printing a structure, the structure including a plurality of pillars. The method for printing can include ejecting only a first drop of a print material such as a liquid metal sequentially at each of a plurality of pillar locations, then ejecting only a second drop of the print material sequentially onto the first drop at each of the plurality of print locations. Additional drops can be ejected at two or more of the pillar locations to form the plurality of pillars. Ejecting only a first drop at each pillar location allows the first drop to cure (i.e., cool or dry) before ejecting the second drop. The printer continues printing while the drops cure, thus improving processing efficiency and increasing production throughput.

16 Claims, 14 Drawing Sheets

(56) References Cited

U.S. PATENT DOCUMENTS

| | | | | |
|---|---|---|---|---|
| 10,661,551 B2* | 5/2020 | Yuan | .................. | B29C 64/20 |
| 2006/0198959 A1* | 9/2006 | Murata | .............. | B81C 1/00111 |
| | | | | 427/256 |
| 2011/0054663 A1* | 3/2011 | Matsui | .................. | B33Y 10/00 |
| | | | | 700/119 |
| 2012/0225208 A1* | 9/2012 | Tanaka | ................ | B41J 2/14016 |
| | | | | 427/265 |
| 2013/0071615 A1* | 3/2013 | Murata | ................. | B05D 1/007 |
| | | | | 428/137 |
| 2015/0217367 A1* | 8/2015 | Dickey | ................ | B29C 64/112 |
| | | | | 164/133 |
| 2015/0245632 A1* | 9/2015 | Mantell | ............... | A23G 1/0066 |
| | | | | 426/104 |
| 2016/0167132 A1* | 6/2016 | Panat | ................. | H05K 1/0313 |
| | | | | 419/53 |
| 2016/0221264 A1* | 8/2016 | Doherty | ................ | B22F 10/00 |
| 2016/0263839 A1* | 9/2016 | Miedema | ................ | B29C 64/40 |
| 2016/0279879 A1* | 9/2016 | Zheng | .................. | B33Y 30/00 |
| 2017/0106589 A1* | 4/2017 | Ishida | .................. | C04B 35/111 |
| 2018/0071959 A1* | 3/2018 | Ishida | .................... | B28B 1/001 |
| 2018/0194061 A1* | 7/2018 | Takahashi | .............. | B33Y 30/00 |
| 2020/0130255 A1* | 4/2020 | Hakkaku | ................ | B33Y 50/02 |

OTHER PUBLICATIONS

Karampelas et al., "Drop-On-Demand 3D Metal Printing," Informatics, Electronics and Microsystems: TechConnect Briefs 2017, 153-155.

VADER Systems MK1 3D Printer Operator Manual 1.0, Last Revised Mar. 19, 2018, 114 pages.

Author Unknonwn, "3D Printing Support Structures: A Complete Guide," AMFG Autonomous Manufacturing, Oct. 17, 2018, 15 pages.

Qi et al., "A novel selection method of scanning step for fabricating metal components based on micro-droplet deposition manufacture," International Journal of Machine Tools and Manufacture 56 (2012) 50-58.

Wang et al., "Direct Printing of 1-D and 2-D Electronically Conductive Structures by Molten Lead-Free Solder," Materials (Basel) Jan. 2017; 10(1):1. published online Dec. 22, 2016, 25 pages.

Contributed by MATERIALISE, "Case Study: Volum-e Reduces Metal Support Removal by 50% Using Materialise e-Stage," downloaded Dec. 2017, 10 pages.

Ko et al., "Metal nanoparticle direct inkjet printing for low-temperature 3D micro metal structure fabrication," J. Micromech. Microeng. 20 (2010) 125010, 7 pages.

Chao et al., "Remelting and bonding of deposited aluminum alloy droplets under different droplet and substrate temperatures in metal droplet deposition manufacture," International Journal of Machine Tools and Manufacture, 69 (2013) 38-47.

Cain, "Supports in 3D Printing: A technology overview," date unknown, 20 pages.

Extended European Search Report dated Dec. 2, 2020 in corresponding European Application No. 20199484.5, 16 pages.

Jafari et al., "Recent progress and challenges with 3D printing of patterned hydrophobic and superhydrophobic surfaces," International Journal of Advanced Manufacturing Technology (2019) 103:1225-1238.

* cited by examiner

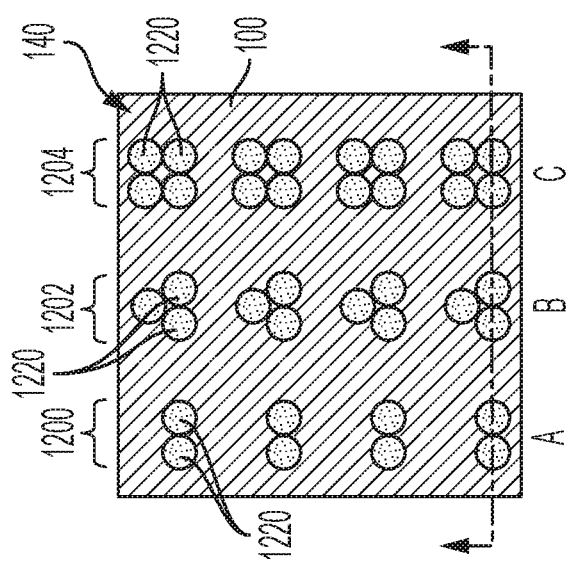
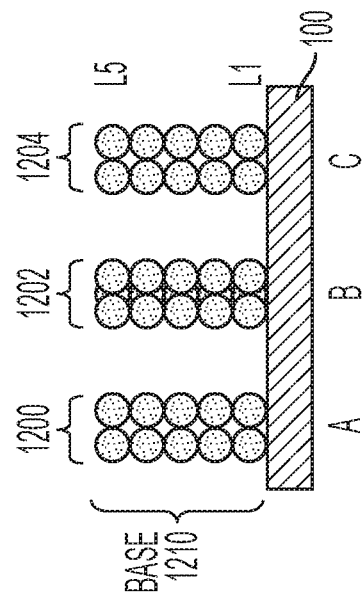
FIG. 12A
FIG. 12B

METHOD FOR SUPPORTING THREE DIMENSIONAL (3D) PRINTED FEATURES

TECHNICAL FIELD

The present teachings relate to the field of three dimensional printing of metal or another material and, more particularly, the printing of a support structure that can be removed prior to completing a printed structure.

BACKGROUND

Techniques for printing three dimensional (3D) structures currently include Fused Filament Fabrication (FFF), which typically prints an extruded polymer, Stereolithography (SLA), which uses a laser to cure or harden a liquid resin, and Selective Laser Sintering, which uses a laser to sinter a powdered polymer material. Three dimensional printing requires the printing of structures and surfaces at all orientations. Some orientations include a surface that forms an unsupported overhang that may extend for a considerable distance. For some printers, a removable second material that is a different composition from the material that forms the overhang of the final structure is printed, where the second material supports the overhang during subsequent fabrication. The second material is removable without damaging the overhanging structure or other features of the printed part. In some cases, the removable material is a powder that supports the feature during printing and, once printing is completed, the powder is removed to leave a gap that the printed feature overhangs. Other techniques include printing of weak support structures from the same material as the completed structure, where the weak support structures can be separated and removed from the printed part after printing has been completed. For metal drop printing the printing of weak support structures can be a slow process that is difficult to control, for example, because of a delicate thermal balance of printing speed and drop size.

A method for printing structures that overcomes the problems of conventional 3D printing methods would be a welcome addition to the art.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, a method for forming a three dimensional printed structure, the printed structure including a plurality of pillars at a plurality of pillar locations, includes ejecting only a first drop of a print material sequentially at each of the plurality of pillar locations from a print head, then ejecting only a second drop of the print material sequentially onto the first drop at each of the plurality of pillar locations from the print head, then ejecting additional drops of the print material sequentially at two or more of the pillar locations to form the plurality of pillars.

Optionally, the method can further include printing the plurality of pillars such that each pillar of the plurality of pillars, when completed, has a height and the height of each pillar of the plurality of pillars varies by no more than one drop diameter from the height of every other pillar of the plurality of pillars. Further optionally, the method can include depositing drops sequentially at the plurality of pillar locations of the plurality of pillars onto a surface of a substrate and completing a formation of the plurality of pillars, then depositing a plurality of drops between adjacent pillars of the plurality of pillars sequentially to form a support surface that is generally parallel to the surface of the substrate. The plurality of drops deposited between adjacent pillars of the plurality of pillars can be suspended between the adjacent pillars and do not physically contact the surface of the substrate.

The method can further include curing each drop while ejecting drops at other pillar locations from the print head, and can include ejecting the additional drops sequentially at the plurality of pillar locations from the print head onto a substrate to form a support surface such that the support surface, when completed, forms an angle of from 0° to 10° with respect to a plane of a surface of the substrate. An implementation can include printing the plurality of pillars such that each pillar of the plurality of pillars, when completed, has a height and the height of a tallest pillar of the plurality of pillars is at least four times the height of a shortest pillar of the plurality of pillars. Drops can be deposited sequentially at every pillar location onto a surface of a substrate and completing a formation of the plurality of pillars, a plurality of drops can be deposited between adjacent pillars of the plurality of pillars sequentially to form a support surface that has a sloped surface that is oblique relative to a plane of the surface of the substrate. The plurality of drops deposited between adjacent pillars of the plurality of pillars can be suspended between the adjacent pillars and do not physically contact the surface of the substrate. The plurality of drops deposited between adjacent pillars of the plurality of pillars can form a ramp that intersects the plane of the surface of the substrate at an angle of from 20° to 70°. In an implementation, the ejecting of only the first drop at each of the plurality of pillar locations and the ejecting of only the second drop at the plurality of pillar locations includes ejecting metal drops including at least one of copper, aluminum, lead, tin, and titanium from the print head, and the ejecting of the print material can include ejecting liquid metal.

In an optional implementation, the print head follows a print path during the ejecting of only the first drop at each of the plurality of pillar locations, the print head repeats the print path during the ejecting of only the second drop at each of the plurality of pillar locations, and the print head repeats the print path during the ejecting of the additional drops sequentially at the two or more of the pillar locations to form the plurality of pillars.

The method can further include printing a printed cap overlying, and physically contacting, the plurality of pillars, wherein the plurality of pillars physically support the printed cap during the printing of the printed cap, and can further include printing a plurality of walls using the print head prior to the printing of the printed cap, wherein the printed cap overlies, and physically contacts, the plurality of walls, and can include physically removing the plurality of pillars from the printed structure subsequent to the printing of the printed cap.

The plurality of pillars can be printed to include a base including a first plurality of levels, wherein each level of the first plurality of levels includes at least two drops of the print material, wherein the at least two drops physically contact each other, and a breakaway including a second plurality of levels, wherein each level of the second plurality of levels includes only one drop of the print material. Each level of the first plurality of levels can include at least four drops of the print material, and each drop in each of the first plurality of levels physically contacts at least one other drop in the same level and at least one other drop in a different level.

The method can further include printing a printed cap overlying the base and the breakaway of each of the plurality of pillars, and physically contacting the breakaway of each of the plurality of pillars, wherein the plurality of pillars physically support the printed cap during the printing of the printed cap. The method can also include separating the printed cap from each breakaway of each pillar of the plurality of pillars.

In another implementation, a method for forming a three dimensional printed product includes forming a sacrificial support structure using a method including ejecting only a first drop of a print material sequentially at each of the plurality of pillar locations from a print head, curing each first drop then ejecting only a second drop of the print material sequentially onto the first drop at each of the plurality of pillar locations from the print head after curing each first drop, curing each second drop then ejecting additional drops of the print material sequentially at two or more of the pillar locations to form the plurality of pillars after curing each second drop. The method also includes forming the three dimensional printed product using a method including ejecting a plurality of third drops onto a plurality of fourth drops while the plurality of fourth drops are uncured, and separating the sacrificial support structure from the three dimensional printed product.

In another implementation, a method for forming a three dimensional printed structure that includes a plurality of pillars at a plurality of pillar locations includes ejecting only a first drop of a print material sequentially at each of the plurality of pillar locations from a print head onto a surface of a substrate to form a first printed layer then ejecting only a second drop of the print material sequentially onto the first drop at each of the plurality of pillar locations from the print head to form a second printed layer on the first printed layer, where each second drop is vertically aligned with one of the first drops; then ejecting additional drops of the print material sequentially at two or more of the pillar locations, where each additional drop is vertically aligned with one of the second drops. The method further includes printing a plurality of drops that are laterally offset from the additional drops to form a plurality of lateral supports, wherein each lateral support bridges two adjacent pillars.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures:

FIG. 12A is a plan view depicting printing of pillar base layers in other implementations of the present teachings.

FIG. 12B is a cross section of the FIG. 12A structure.

Figure 1:
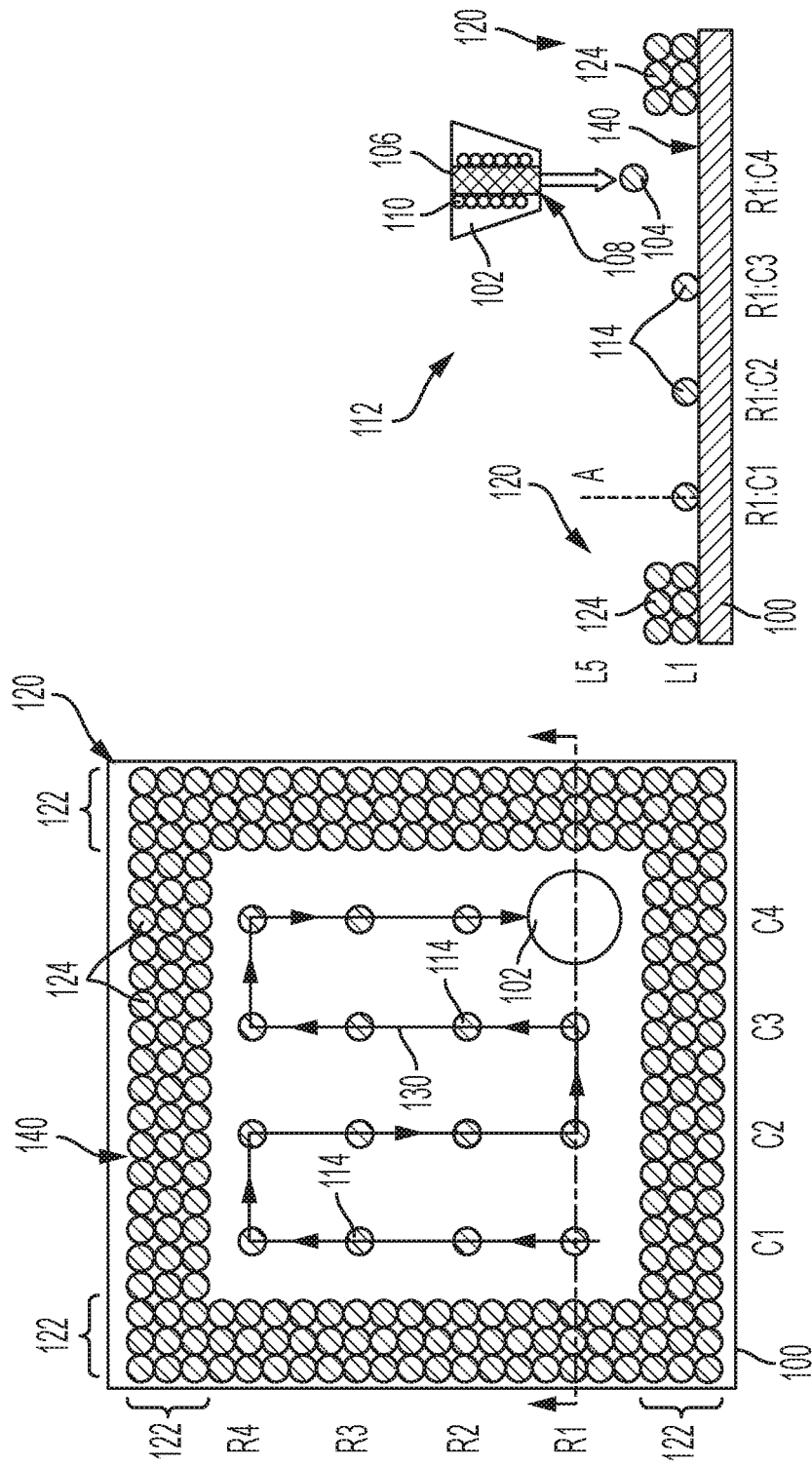
FIG. 1A is a plan view depicting printing of a first layer of material at a plurality of pillar locations during an implementation of the present teachings.
FIG. 1B is a cross section of the FIG. 1A structure.
Figure 2:
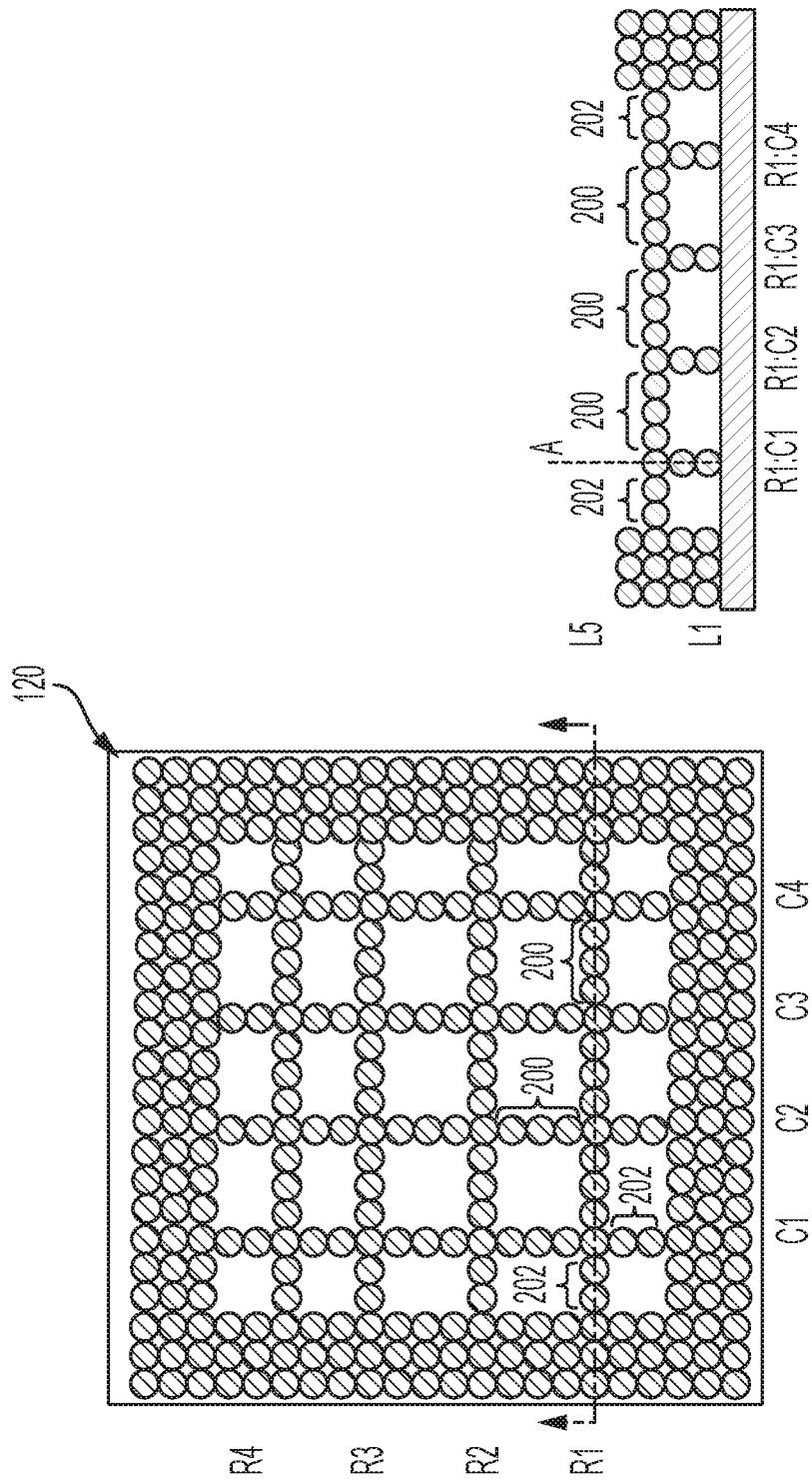
FIG. 2A depicts the FIG. 1A structure after further printing of pillars, lateral supports, and an in-process product.
FIG. 2B is a cross section of the FIG. 2A structure.
Figure 3:
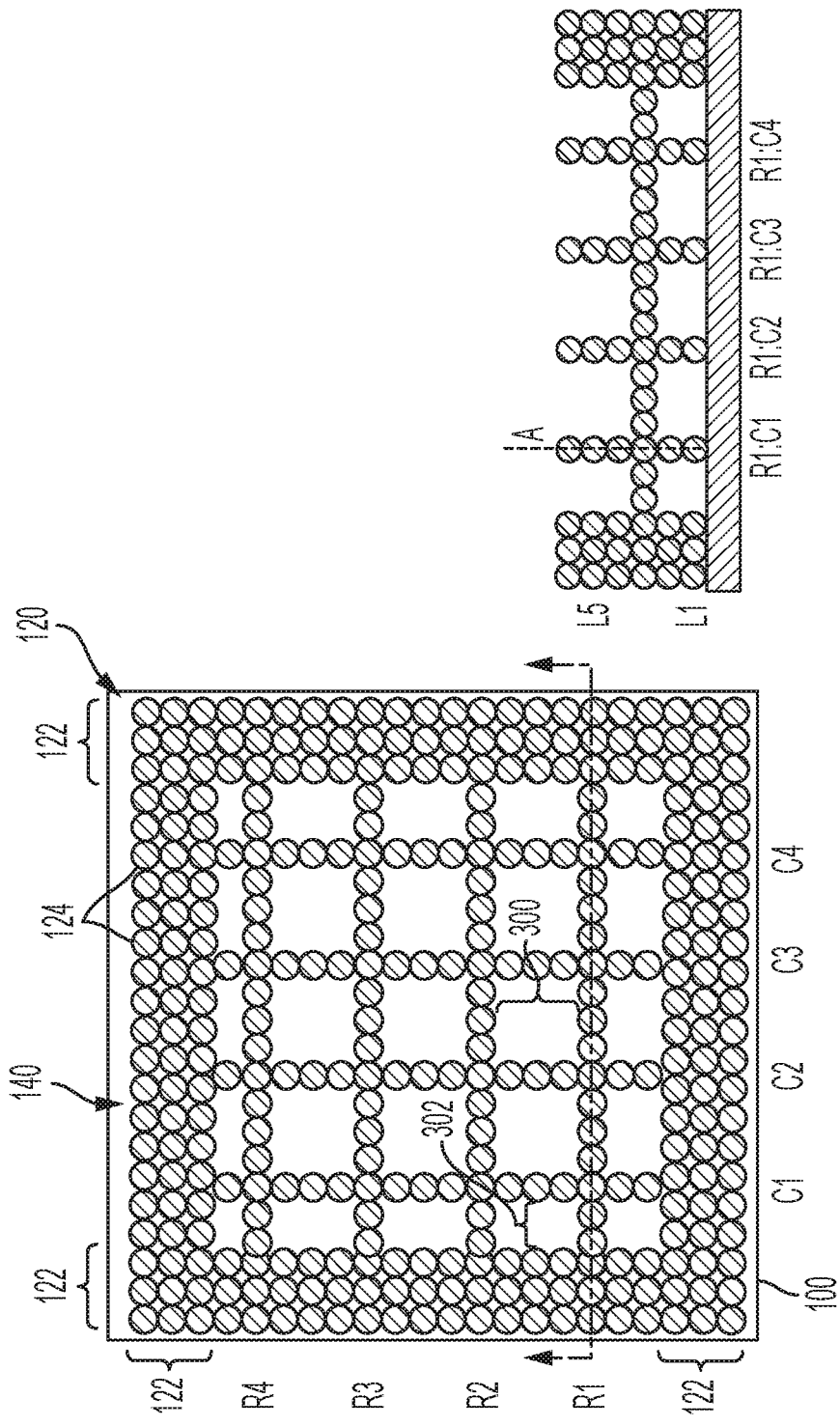
FIG. 3A depicts the FIG. 2A structure after further printing of pillars and the in-process product.
FIG. 3B is a cross section of the FIG. 3A structure.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As used herein, unless otherwise specified, the word "printer" encompasses any apparatus that performs a print outputting function for any purpose.

As discussed above, 3D printing (also referred to herein as "additive manufacturing") of support structures that can be removed from a printed product without damaging the printed product can be useful for forming various 3D features such as supports for other printed features and/or for forming overhanging or unsupported structures. This can include printing physically weak structures that can be removed from the printed product after printing. In some instances, the support structures are printed in locations that may be difficult or impossible to access and thus the structures may not be removed and remain as part of the 3D object.

FIGS. 1A-5 depict a method for forming a printed product according to an implementation of the present teachings. In this implementation, the formation of the printed product includes the formation of a support structure that is horizontally oriented relative to a surface 140 of a print substrate 100. In FIGS. 1A-4B, the "A" figures depict the in-process structure in plan view and the "B" figures depict the in-process structure in cross section, where the cross sectional location is shown as a dashed line in the corresponding "A" figure.

FIG. 1A is a plan view, and FIG. 1B is a cross sectional view of FIG. 1A, depicting the print substrate (i.e., substrate) 100 such as a print bed and a print head 102. It will be appreciated that the print substrate 100 may be stationary and the print head 102 may move in three axes (X-, Y-, and Z-directions) relative to the substrate 100, or the print head 102 may be stationary and the print substrate 100 may move in three axes relative to the print head 102, or both the print substrate 100 and the print head 102 may move relative to each other in one or more axes. The print head 102 is configured to eject drops 104 of a print material 106 from an orifice 108 of the print head 102 using an ejector 110 such as an electromagnetic coil. It will be appreciated that while the figures depict a single print head 102, printers having two or more print heads 102 and/or print heads 102 having two or more orifices 108 are contemplated.

The drops 104, when printed (i.e., when ejected, dispensed, or deposited), can include a liquid material such as a liquid metal drop (e.g., copper, aluminum, lead, tin, titanium, etc.), a metal alloy (e.g., bronze, Inconel, or a metal alloy including at least one of nickel, chromium, steel such as stainless steel, and iron), a polymer (e.g., nylon, plastic, etc.), or another suitable print material. The print substrate 100 and print head 102 may be part of a printer 112, for example, a metal/metal alloy printer including MagnetoJet technology. Such printers have been available from Vader Systems of Getzville, N.Y.

FIGS. 1A and 1B further depict a plurality of pillars 114 during formation. For purposes of explanation, the figures depict the formation of 16 pillars 114 arranged in a 4×4 grid along four rows (R1-R4) and four columns (C1-C4), although other structures including more or less than 16 pillars are contemplated. Further, the pillars need not be linearly aligned, but can be formed along a curve, a circle, or another pattern, depending on the design of the structure being formed.

Figure 5:
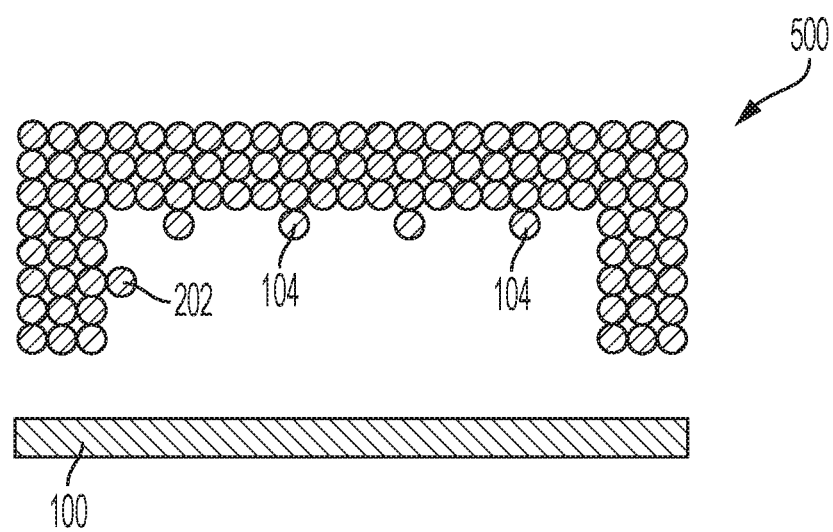
FIG. 5 depicts the FIG. 4B structure after removal of the in-process product from a print substrate and the support structure from the in-process product to form a completed product.
Figure 6:
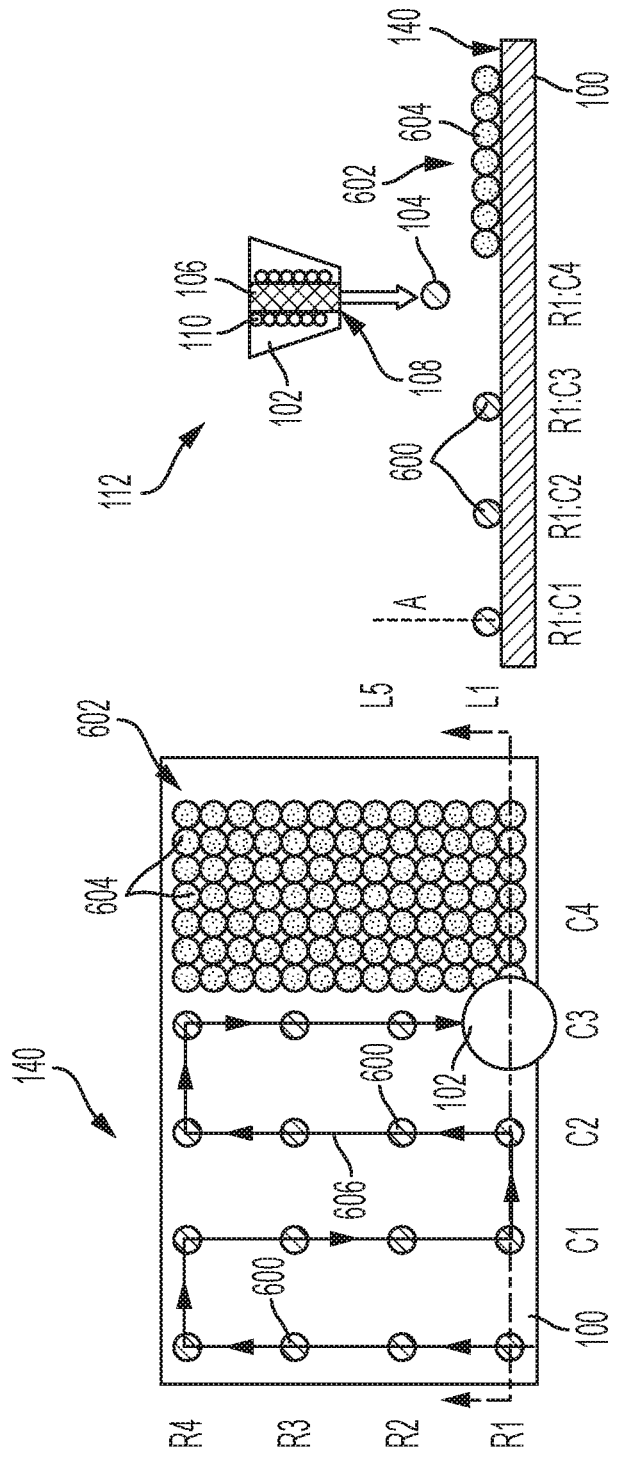
FIG. 6A is a plan view depicting printing of a first layer of material at a plurality of pillar locations during another implementation of the present teachings.
FIG. 6B is a cross section of the FIG. 6A structure.
Figure 7:
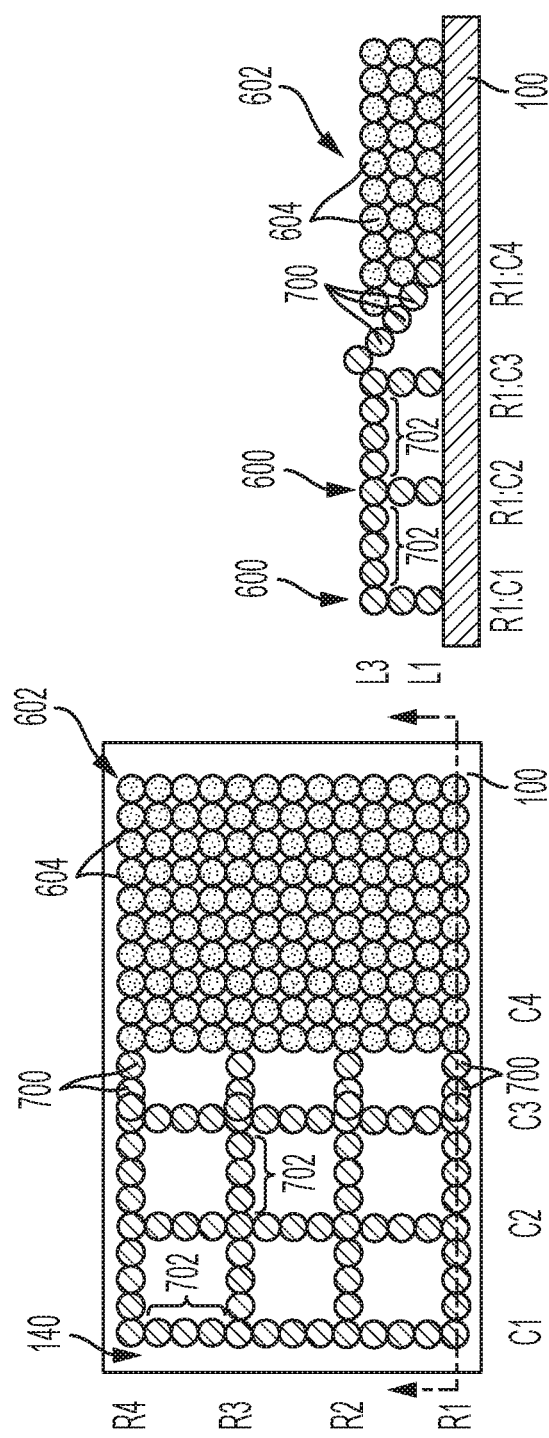
FIG. 7A depicts the FIG. 6A structure after further printing of an in-process structure, pillars, and lateral supports.
FIG. 7B is a cross section of the FIG. 7A structure.

FIGS. 1A and 1B further depict an in-process printed product 120 formed from a plurality of printed drops 124 that will form at least a portion of a completed printed product 500 (FIG. 5, further described below). The printed product 120 will typically be formed by printing using the print head 102 and is thus depicted as a plurality of drops, although other formation methods are contemplated. In FIG. 1A, the printed product 120 is depicted as an endless square structure having a plurality of walls (e.g., four walls) 122 that are formed perpendicular to, and extend away from, the print substrate 100, although printed products having other shapes and features are contemplated.

In conventional metal printing, it is desirable to print a second drop on a first drop immediately after printing the first drop. This ensures that the first drop is at a temperature that is relatively close to its melting temperature when the second drop is printed onto the first drop. When the second drop is printed, the thermal mass of the second drop heats the first drop that is already relatively close to its melting temperature, resulting in the first and second drops fusing together after curing (e.g., after drying, cooling, solidifying, freezing, or otherwise curing), thereby ensuring that the first and second drops are well bonded together. Subsequent drops are similarly printed onto a previous drop that is at a temperature that is relatively close to its melting temperature so that the totality of drops that form the final structure are fused together and resistant to damage from physical stresses and strains. The printed product 120 can be formed this way to ensure structural integrity and robustness.

However, the pillars 114 that form the support structure, in some uses, are to be removed from the printed product 120 prior to forming the completed product 500, and are thus sacrificial support structures. The pillars 114 are most easily removed if mechanical bonds between adjacent drops are weaker, but should be sufficiently robust to ensure the structures remain intact until they are removed to complete the printed product. In this implementation, a first drop 104 that is used to form a given pillar or other related support structure features are allowed to cure (e.g., dry, cool, solidify, freeze, or otherwise cure) before printing a second drop 104 on the first drop. However, to maximize printing speed and product throughput, printing of other drops 104 of other pillars 114 continues while a previously printed drop cures. FIG. 1A depicts a print path 130 taken by the print head 102 during printing of the plurality of pillars 114. FIGS. 1A and 1B depict the print head 102 completing printing of drops 104 along the print path 130 and printing the final drop 104 at location R1:C4. After completing the drop 104 at location R1:C4, the print head 102 prints a second drop 104 at location R1:C1, then at the other locations R2:C1 to R1:C4. Repeating the same print path 130, or at least a portion of the same print path 130, when printing at locations of the pillars 114 in the subsequent layer can reduce inconsistencies in drop placement and can help to ensure that the subsequent drops land primarily on top of the previously printed drops.

FIGS. 1A and 1B further depict printing of the in-process printed product 120 during the printing of the pillars 114. The printing of the in-process printed product 120 can include printing of the in-process printed product 120 can be performed using any desired print path, as each drop 124 that forms the in-process printed product 120 does not need to cure before printing another drop 124 on a previously printed drop 124, but each printed layer L1-L6 of the pillars 114 and the printed product 120 is printed vertically (i.e., away from the surface 140 of the substrate 100) in sequence. In other words, the drops 104, 124 in L1 are printed before printing the drops 104, 124 in L2, etc. As understood by one of ordinary skill in the art, this minimizes physical contact and interference between taller, previously printed structures and the print head 102 while printing lower layers. In FIGS. 1A and 1B, one layer L1 of drops 104 of the pillars 114 are printed, while two layers (L1 and L2) of the printed product 120 is printed.

In conventional processes, a first drop is still hot and/or molten when a second drop is immediately printed on the first drop. With an implementation of the present teachings, allowing a first drop 104 of each pillar 114 to cure prior to printing a second drop decreases the duration of time that each drop 104 is hot and/or molten. A pillar 114 printed using a low drop print frequency has a smaller maximum diameter due to reduced drop flow before curing (i.e., before becoming solidified). A pillar formed in accordance to the present teachings produces a pillar having a height that is more reproducible than when printing a second drop on an uncured or partially cured pillar. This improved pillar height reproducibility results, at least in part, because a flattening of a molten drop when a subsequent drop is printed thereon, which is difficult to control, is reduced or eliminated with an implementation of the present teachings.

After printing a structure similar to that depicted in FIGS. 1A and 1B, printing can continue as depicted in FIGS. 2A and 2B, where three layers (L1-L3) of the pillars 114 have been printed using the print path 130 of FIG. 1, and four layers (L1-L4) of the in-process printed product 120 have been printed using any desired print path. Additionally, in some structures, it is desirable to target printing so that the pillars 114 are perpendicular to a plane of the surface 140 of the print substrate 100. In some instances, particularly for taller pillars 114, the pillars 114 may be prone to leaning, tipping, tilting, etc., away from the perpendicular. Further, relatively tall pillars can vibrate or deform elastically and/or plastically during printing, thereby decreasing the placement accuracy of subsequently printed drops. To mitigate or eliminate these problems, it may be desirable to deposit optional first lateral supports 200 between, and that physically connect and bridge, two adjacent pillars 114, and second lateral supports 202 that physically connect one of the pillars 114 with one or two (in the instance of the corner pillars 114 located at R1:C1, R4:C1, R4:C4, and R1:C4) of the walls 122 of the printed product 120. FIGS. 2A and 2B depict the lateral supports 200, 202 printed at level L3, although the lateral supports 200, 202 may be printed at any level, and may be printed at two or more different levels. To print the lateral supports 200, 202, the print head 102 is laterally offset from the axis "A" of one of the partially formed pillars 114 prior to ejecting the drop 104 from the orifice 108 of the print head 102. These lateral or diagonal supports 200, 202 brace and stiffen the pillars 114 and may reduce or eliminate lateral movement of the pillars 114 during printing and/or transport.

Printing can therefore continue until the pillars 114 and the in-process printed product 120 have been printed to a desired height as depicted in FIGS. 3A and 3B. At FIGS. 3A and 3B, the formation of the pillars 114 has been completed. FIG. 3B depicts the pillars 114 printed six layers high (L1-L6) for purposes of explanation, although pillars 114 can be printed to any desired height. If the pillars 114 grow at a different height than the walls 122, then either fewer or greater numbers of drops can be used to print the pillars 114 so the heights of the pillars 114 match the wall and each other to within the change in height of the pillars 114 produced by a single drop. Next, spaces or gaps 300 between each adjacent pillar 114 and spaces or gaps 300 between each pillar 114 and wall 122 are filled in to form a support surface 400, depicted in FIG. 4B at level L6. To print the drops that form the support surface 400, the print head 102 is laterally offset from the axis "A" of one of the completed pillars 114 and from the walls 122 prior to ejecting the drop 104 from the orifice 108 of the print head 102. After forming the support surface 400, additional printing onto the support surface 400 can continue to form a printed cap 402, the printed cap 402 including a plurality of layers of drops, where the printed cap 402 is connected to the walls 122 to form a completed printed structure 404. Thus during formation of the printed structure 404, the pillars 114 provide support to allow printing of the support surface 400 and the printed cap 402.

Next, as depicted in FIG. 5, completed printed structure 404 is removed from the print substrate 100. Further, in some implementations, the support structure, including the pillars 114 and (if present) the lateral supports 200, 202, are removed from printed structure 404 to form the completed printed product 500, and are thus sacrificial support structures. It will be appreciated that some portion of the pillars 114 and the lateral supports 200, 202 may remain on the completed product 500 as depicted, or they may be completely removed.

In this implementation, each pillar 114 of the plurality of pillars, when completed, is formed to the same height as the other pillars 114 of the plurality of pillars as depicted in FIG. 3B. For purposes of this disclosure, pillars 114 that have the same height have a height that is within ±5% of the height of every other pillar 114 of the plurality of pillars. This allows the formation of the support surface 400 generally parallel to the surface 140 of the print substrate 100, and is thus, relative to the surface 140 of the print substrate 100, horizontally oriented. The support surface 400 when completed, forms an angle of from about 0° (i.e., parallel) to about 10°, or from about 0° to about 5° with respect to a plane of the surface 140 of the substrate 100.

Additionally, printing the plurality of drops 104 that form the pillars 114 along the print path 130, includes ejecting only a first drop of print material sequentially at each of the plurality of print locations (i.e., each location from R1:C1 to R1:C4) from the print head 102. Subsequently, only a second drop 104 of the print material is ejected sequentially onto the first drop 104 at each of the plurality of pillar locations. Finally, additional drops are ejected sequentially at two or more of the pillar locations to form the plurality of pillars 114. Printing sequentially at each pillar location ensures that each drop fully cures (e.g., cools) before printing another drop on the subsequently printed drop. In contrast to the drops used to print the pillars 114, the drops used to print the completed printed product 500 can be printed such that overlying drops are printed before the underlying drops have fully cured. This improves structural robustness of the completed printed product 500 and mitigates removal of the pillars 114.

FIGS. 6A-11 depict another implementation of the present teachings. In this implementation, the pillars 600 are formed to provide a support structure for features of the printed product 602, where the support structure includes a surface at an oblique angle relative to the print substrate 100. The support structure can be subsequently removed, at least in part, after serving this function as described in more detail below prior to completion of the printed product 1100. The angled support structure allows the printed product 602 to include an overhang relative to the substrate 100. In this implementation, as with the implementation discussed above relative to FIGS. 1A-5, each drop 104 of each pillar 600 is printed, then allowed to cure before printing another drop 104 on the previously printed drop of the pillar 114. However, to maximize product throughput, the print head 102 continues to print drops 104 of other pillars 600 while each previously printed drop 104 cures.

FIG. 6A depicts an example print path 606 for printing each drop 104 of each pillar 600 of the 4×4 grid. The print path 606 may be the same or different than the print path 130. To execute the print path 606 and the formation of the pillars 600, the print head 102 first deposits a single, first drop 104 for the pillar 600 at location R1:C1, then deposits a single, first drop 104 for the pillar 600 at location R2:C1. As depicted in FIG. 6B, the printing of a first layer "L1" of drops 104 is completed when the drop 104 is printed at location R1:C4. Thus the drop 104 at R1:C1 cures during duration of time that the print head 102 prints the other 15 drops of the 4×4 grid. FIG. 6B also depicts formation of a first layer "L1" of the printed product 602 by printing of the drops 604 that form the printed product 602. For purposes of illustration, the printed drops 604 that form the printed product 602 are depicted with different hatching than the printed drops 104 that form the pillars 600; however, it will be appreciated that the drops 604 can be the same size and composition as drops 104 when printed by the print head 102. The drops 104 in each of the layers L1-L10 that form the pillars 600 are printed in the sequence indicated by the print path 606 so that each layer L1-L10 of support structure 900 (FIG. 8 described in detail below) is printed in sequence. The printed product 602 can be printed in any desired print path as each drop 604 does not need to cure before printing another drop 604 on a previously printed drop 604, but each layer L1-L10 of the pillars 600 and the printed structure 602 is printed vertically (i.e., away from the surface 140 of the substrate 100) in sequence. In other words, the drops 104, 604 in L1 are printed before printing the drops in L2, etc. As understood by one of ordinary skill in the art, this minimizes physical contact and interference between taller, previously printed structures and the print head 102 while printing lower layers. In FIGS. 6A and 6B, one layer L1 of the printed product 602 is printed.

Once the first layer L1 of drops 104, 604 is printed, the print head 102 can then again execute the print path 606 to print subsequent drops 104. That is, the print head 102 will deposit a second drop 104 in layer L2 onto the first drop 104 in layer L1 of the pillar 600 at location R1:C1, a second drop 104 in layer L2 onto the first drop 104 in layer L1 of the pillar 600 at location R2:C1, etc. Printing of the printed product 602 and the pillars 600 can thus continue, where the print head 102 repeatedly follows, and executes sequential printing along, the print path 606 to print the 4×4 grid of pillars 600. It will be appreciated that the print path the print head 102 follows can vary between layers, but no two drops 104 are sequentially printed for any single pillar 600 so that the printed drops 104 for each pillar 600 have sufficient time to cure. In this implementation, generally, the drops 604 that form a given layer of the printed product 602 will be ejected from the orifice 108 of the print head 102 after ejecting the drops 104 that form the given layer of the support structure 900, as the printed product 602 will generally overlie the support structure 900. However, in some uses, it may be desirable to print one or more layers of the support structure 900 before printing the corresponding layer of the printed product 602.

Thus printing can continue until the pillars 600 and the printed structure 602 are completed.

During printing of the pillars 600, laterally offset drops 700 can be optionally printed that are laterally offset from the axes A of the pillars 600. The location of the laterally offset drops 700 will depend on the design of the support structure 900. In FIG. 7B, three laterally offset drops 700 are depicted attached to the drop 104 at location R1:C4, two of which can be seen in FIG. 7A. The laterally offset drops 700 are also formed at each pillar 600 in column C4 (i.e., at each of R1:C4, R2:C4, R3:C4, and R4:C4), as also depicted in FIG. 7A. These laterally offset drops 700 can be printed perpendicular to a plane of the surface 140 of the print substrate 100. In some instances, particularly for taller pillars 600, the pillars 600 may be prone to leaning, tipping, tilting, vibration, plastic and/or elastic deformation, etc., away from the perpendicular, for example, as discussed above with reference to FIGS. 2A and 2B. The laterally offset drops 700 can form optional lateral supports 702 that physically connect two adjacent pillars 600. FIGS. 7A and 7B depicts the lateral supports 702 printed at level L3, although the lateral supports 702 may be printed at any level, and may be printed at two or more different levels. To print the lateral supports 702, the print head 102 is laterally offset from the axis "A" of one of the partially formed pillars 600 prior to ejecting the drop 104 from the orifice 108 of the print head 102.

Figure 8:
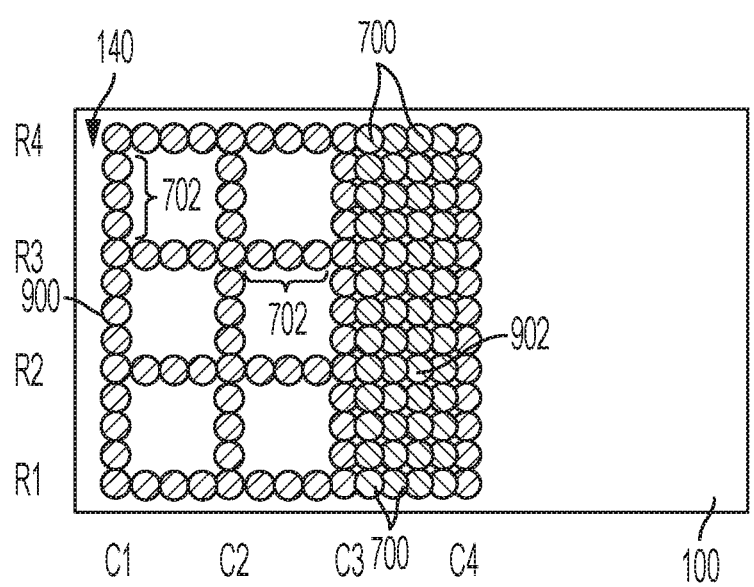
FIG. 8 is a plan view with the in-process structure removed to show detail of a partially completed ramp that forms a support surface for the in-process structure.
Figure 9:
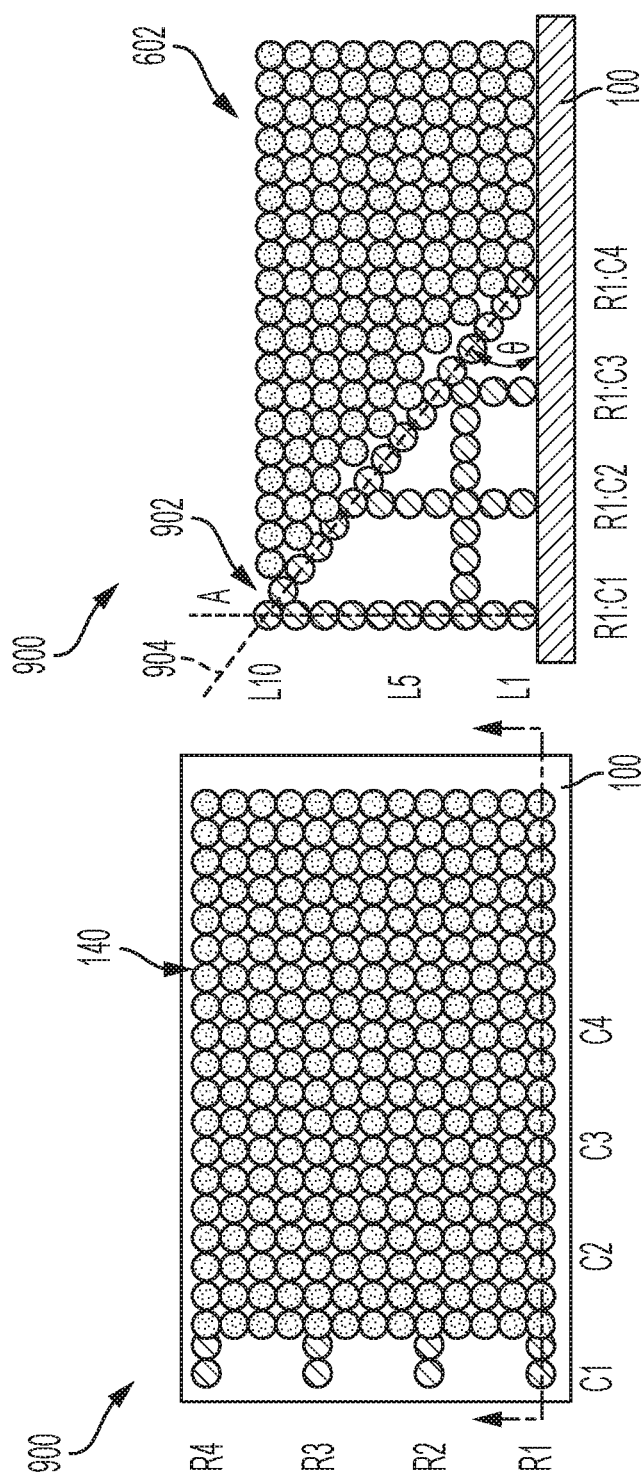
FIG. 9A depicts the FIG. 7A structure after completion of the support structure including the pillars, lateral supports, and ramp, and after further printing of the in-process structure.
FIG. 9B is a cross section of the FIG. 9A structure.
Figure 10:
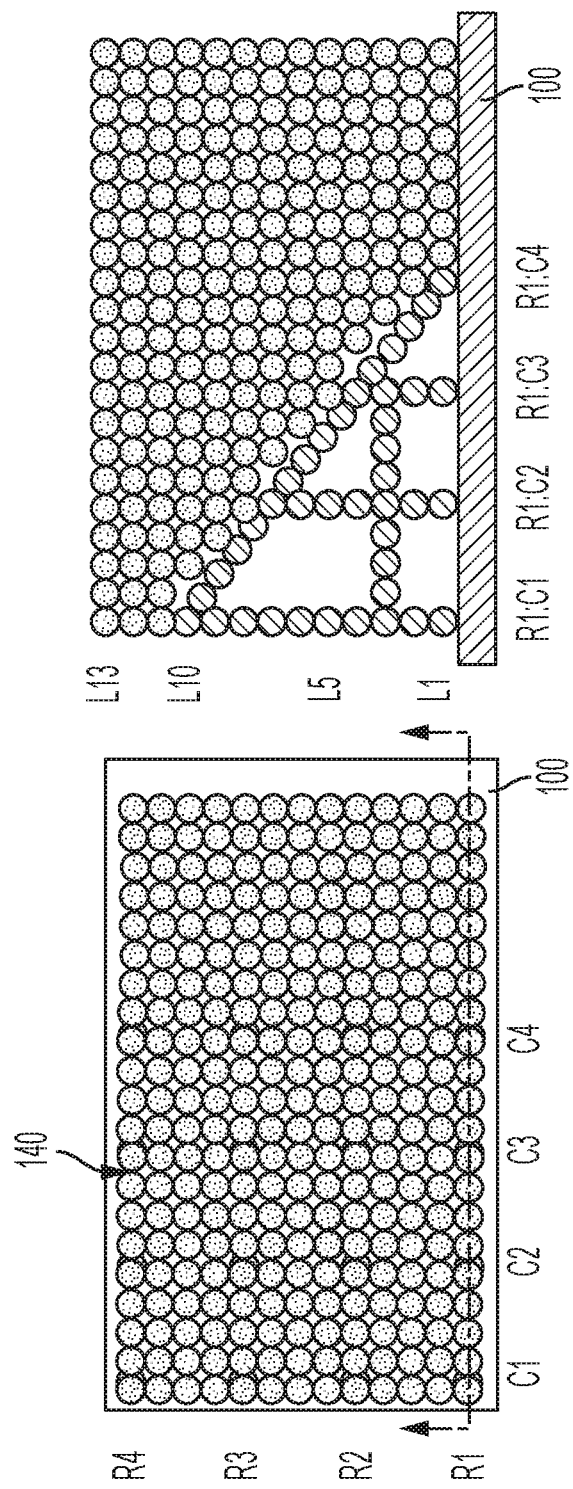
FIG. 10A depicts the FIG. 9A structure after further printing of the in-process structure being supported by the ramp.
FIG. 10B is a cross section of the FIG. 10A structure.

These laterally offset drops 700 assist in the formation of a ramp 902 (FIG. 9) as a support surface that is part of the support structure 900. The ramp 902 is formed by filling in the spaces between the pillars 600 with drops 104 printed using the print head 102. Thus the drops 104 that fill the spaces at each layer are printed prior to printing the drops 604 that form the printed structure 602. FIG. 8 is a plan view of FIG. 7B with the printed product 602 removed. FIG. 8 depicts the partially completed support structure 900 and the partially completed ramp 902. Referring to FIG. 9B, the ramp 902 is formed at an oblique angle theta "θ," where θ is defined by the vertical axis A through one of the pillars 600 and an oblique line 904 that is the line of best fit (i.e., trend line) through the centers of the uppermost drop 104 of each of the pillars 600. In an implementation, θ can be from about 20° to about 70°, or from about 30° to about 60°.

Subsequently, printing of the pillars 600, the laterally offset drops 700, and the ramp 902 continues to form the structure depicted in FIGS. 9A and 9B. In FIGS. 9A and 9B the support structure 900, including the ramp 902, has been completed. Further printing of drops 604 to add to the printed product 602 can subsequently continue to form the structure of FIGS. 10A and 10B which completes the printing of the printed product 602. In FIG. 10B, the pillars 600 are depicted as being 10 levels tall (L10) and the printed product 602 as being 13 levels tall (L13), although the pillars 600 and printed product 602 can be formed to any desired height relative to the surface 140 of the print substrate 100.

Figure 11:
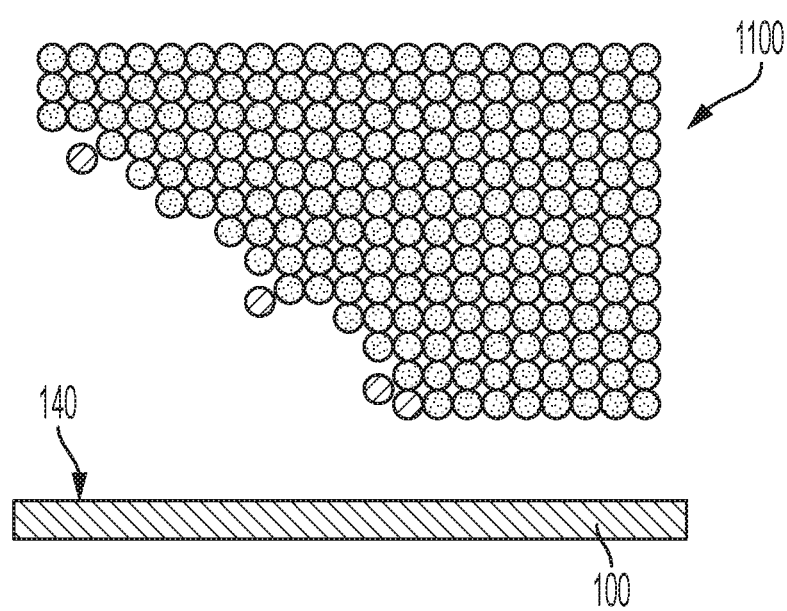
FIG. 11 depicts the FIG. 10B structure after removal of the in-process product from a print substrate and the support structure from the in-process product to form a completed product.

Subsequently, the printed product 602 can be removed from the print substrate 100 and, in some implementations, the pillars 600 and support structure 900 can be removed to result in the final printed product 1100 as depicted in FIG. 11, and thus the pillars 600 and support structure 900 may be sacrificial. It will be appreciated that some printed drops 104 from the support structure 900 (pillars 600, lateral supports 702, and ramp 902) may remain on the final printed product 1100 as depicted, or may be completely removed.

While the pattern of pillars 600 is shown as a square array printed using a serpentine pattern with straight line moves of the print head 102, it is contemplated that other patterns of pillars that are not in a straight lines may be printed along curved, or approximations to curved, paths. This may be beneficial if a series of pillars is printed along a curve, where all of the pillars meet the solid surface on which the 3D part is built at the same layer. Thus the portion of the path that prints that series of pillars can be repeated until they need to be connected to form a solid surface. At that point, the dots connecting that series of pillars can be printed while the print head traverses that same printed path or a portion of the printed path. The lines connecting that series of pillars to a neighboring set of pillars printed with a second printed path may be a curve that is parallel to the first printed path if the second printed path is a parallel curve to the first printed path or may be interpolated between the first and second printed paths.

In an implementation of the present teachings, adjacent pillars can be printed such that they are spaced from each other at a distance of from about 0.1 millimeters (mm) for very small drops with close spacing to about 10.0 mm, particularly when lateral supports as described above are used. In other implementations, adjacent pillars can be spaced from each other at a distance of from about 1.0 mm to about 5.0 mm, or from about 2.0 mm to about 3.0 mm. The drops printed can have a mean diameter of from about 50 microns (μm) to about 700 μm, or from about 200 μm to about 600 μm, or from about 400 μm to about 500 μm. Additionally, the completed pillars, when unsupported by lateral supports, can have a height of from about 0.2 mm (depending on drop diameter) to about 1.0 meters. In some instances, pillars heights can be over 1.0 meters, for example from about 1.0 meter to 1.8 meters, depending on dynamic loads, thermal deformation, etc. It is estimated that pillars will self-buckle at heights over about 1.8 meters. When supported by lateral supports, pillar heights can range from about 0.2 mm to several meters, for example, 3.0 meters or more. Typically, depending on the structure being formed, pillar heights can range from about 1.00 mm to about 500 mm, or from about 1 mm to about 300 mm.

In this implementation, each pillar 114 of the plurality of pillars, when completed, has a different height the each of the other pillars 114 of the plurality of pillars as depicted in FIG. 10B. In one implementation, each pillar 114 will have a height that is ±10% taller or shorter that every other pillar 114 of the plurality of pillars. In another implementation, each pillar of the plurality of pillars, when completed, has a height and the height of a tallest pillar of the plurality of pillars is at least four times the height of a shortest pillar of the plurality of pillars. This allows the formation of the ramp 902 to form an oblique angle with the surface 140 of the print substrate 100.

As discussed above, the lateral supports 200, 202, 702 provide support for the pillars 114, 600 as the pillars 114, 600 are being formed and prior to removal, which reduces leaning or toppling of the pillars 114, 600. The lateral supports 200, 202, 702 support the pillars 114, 600, and the pillars 114, 600 support at least a portion of the printed product 500, 1100, prior to the completion of the printed product 500, 1100. In another implementation, an alternate technique for supporting the pillars is provided as depicted in FIGS. 12A-13B, where the "A" figures are plan views and the "B" figures are cross sections along the location identified in the "A" figures. In FIGS. 12A-13B, three columns A-C of pillars 1200-1204 having different types of bases 1210 are depicted. Pillars 1200 in column A include two drops 1220 per level, pillars 1202 in column B include three drops 1220 per level, and pillars 1204 in column C include four drops 1220 per level. While three different types of bases 1210 are depicted for purposes of illustration, where each column A-C includes a different type of base 1210, it will be appreciated that a structure can include a plurality of columns with only one of the types of bases 1210. However, it will be further appreciated that a structure can include two of the types of bases 1210, or all three of the types of bases, depicted in columns A-C.

To form the bases 1210 FIGS. 12A, 12B, only a first drop 1220 is printed at level L1 for each base 1210 in each column A-C. Subsequently, a second drop 1220 is printed at level L1 for each base 1210 in each column A-C adjacent to the first drop. For pillars 1202 and 1204, a third drop 1220 is printed at L1 for each base adjacent to the first two drops 1220 and, for pillars 1204, a fourth drop 1220 is printed at L1 for each base 1210 adjacent to the first three drops. Printing one drop 1220 at a time for each pillar 1200-1204 ensures that each drop 1220 cures prior to printing a subsequent drop adjacent to the prior drop for each base 1210 at each pillar location. The drops 1220 can be printed, for example, in one of the print paths 130, 606 previously described, or another print path. Subsequent drops 1220 are similarly printed in additional levels until the base 1210 of each pillar 1200-1204 is completed. FIG. 12B depicts five levels L1-L5 to form each base 1210, but it will be appreciated that a base can be more or less than five levels. The drops 1220 for each level L1-L5 can physically contact at least one other drop 1220 in the same level and at least one other drop 1220 in a different level.

Figure 13B:
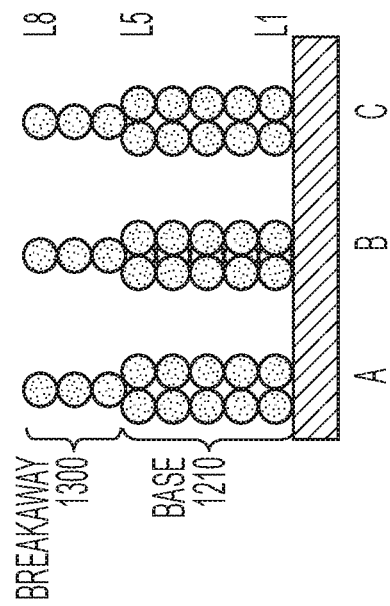
FIG. 13B depicts a breakaway being three levels high.
Figure 13A:
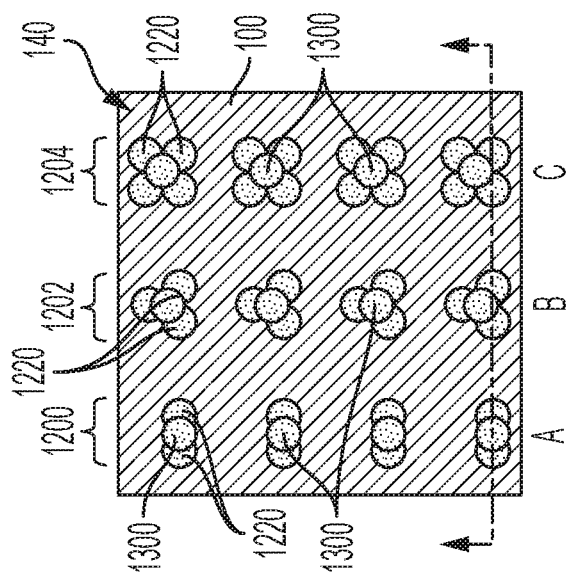
FIG. 13A depicts the FIG. 12A structure after further printing of a breakaway layer on the base layer of each pillar.

Next, a breakaway 1300 is printed on each base 1210 as depicted in FIGS. 13A, 13B. The breakaway 1300 includes a single drop 1220 printed at each level L6-L8. While FIG. 13B depicts the breakaway as being three levels high, the breakaway 1300 can be one or more levels high. Subsequently, an overlying structure such as the printed cap 402 depicted and described above (not depicted in FIGS. 13A, 13B for simplicity), or another overlying structure, can be formed to physically contact the breakaway 1300.

During formation and use of the pillars 1200-1204, the base 1210 which includes two or more drops 1220 at each level, provides a relatively strong and stable support for the pillar 1200-1204 compared, for example, to a pillar which includes only a single drop at each level. While these pillars 1200-1204 formed with a reinforced base 1210 may not require a separate supporting structure such as a lateral support 200, 202, 702, it is contemplated that a lateral support may be formed to further support the pillars 1200-1204. Additionally, each breakaway 1300 physically contacts an overlying structure such as printed cap 402 with only a single drop 1220, and thus the physical connection with a product is weak and the support structure that includes the pillars 1200-1204 is more easily removed than if the pillars 1200-1204 were formed to include only the base 1210 from the surface 140 to the product. Thus the relatively stronger reinforced base 1210 strengthens each pillar 1200-1204 of each column A-C and reduces or prevents toppling of the pillars 1200-1204 during formation, while the relatively weaker breakaway 1300 mitigates separation from the product by including a single drop 1220 for each pillar 1200-1204 as a contact point with the product.

Figure 4:
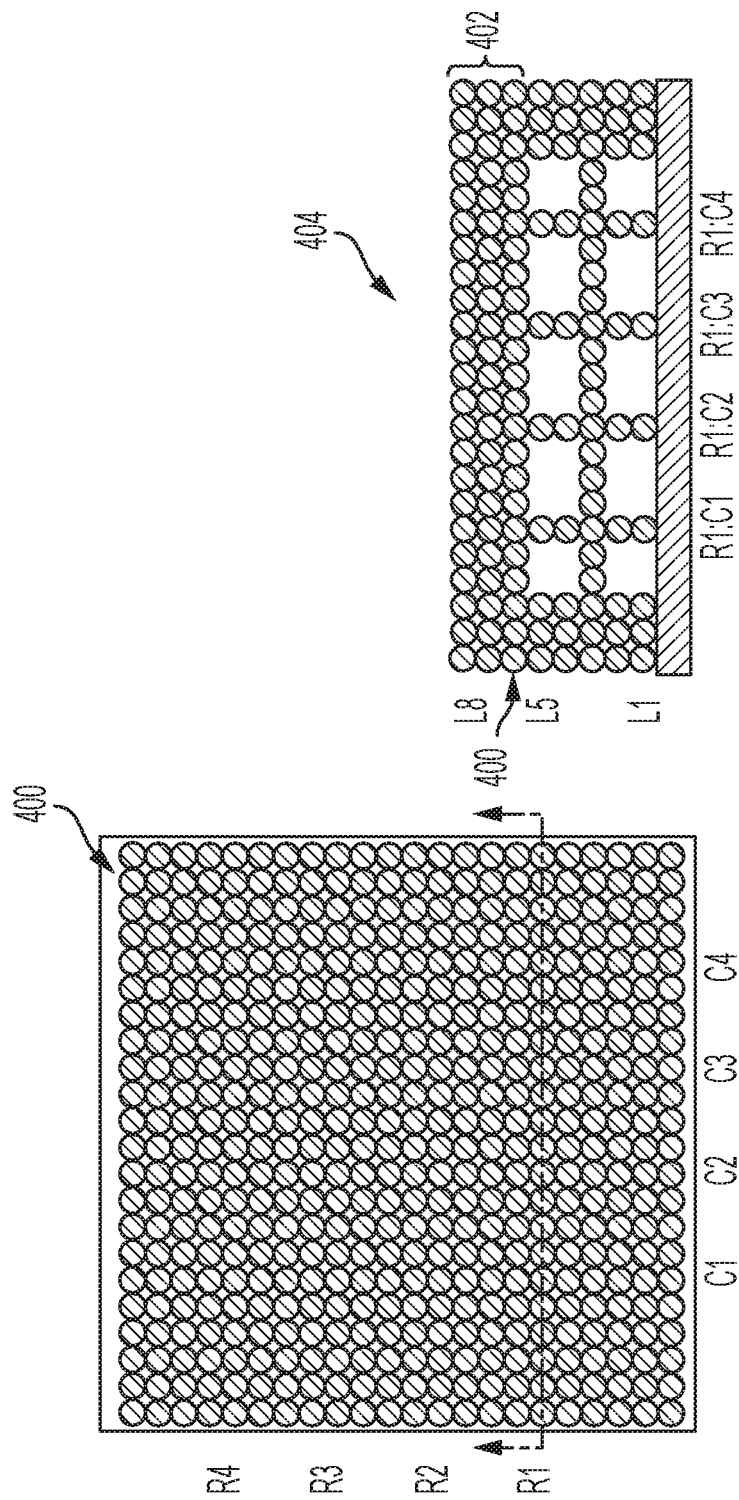
FIG. 4A depicts the FIG. 3A structure after printing of a support surface and a printed cap.
FIG. 4B is a cross section of the FIG. 4A structure.
Figure 14:
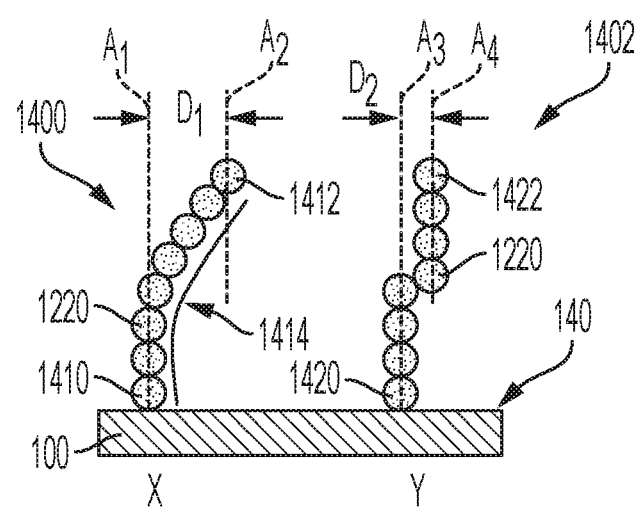
FIG. 14 is a cross section of other implementations of the present teachings that can mitigate removal of a support structure from a printed product subsequent to printing.

FIG. 14 is a cross section depicting two additional types of pillars that can be used to form a support structure that is easily separated from a product. A first type X of pillar 1400 includes a plurality of drops 1220 that are laterally offset from each other. FIG. 14 depicts a first vertical axis $A_1$ that extends through a center of a first drop 1410 of the pillar 1400, where the first drop 1410 physically contacts the surface 140 of the print substrate 100. FIG. 14 further depicts a second vertical axis $A_2$ that extends through a center of a second drop 1412 of the pillar 1400, where the second drop 1412 physically contacts a product such as a printed cap 402 (FIG. 4, not depicted for simplicity). The pillar 1400 can include additional drops 1220 positioned between the first drop 1410 and the second drop 1412. The first axis $A_1$ is laterally offset from the second axis $A_2$ by a distance $D_1$. In one aspect, the distance $D_1$ can be from about 200 μm to about 2,800 μm, depending on the mean diameter of the drops. In another aspect the distance $D_1$ can be from about 1.0 times to about 10.0 times a mean or target diameter of the drops 1220 (where the target diameter can be measured in any direction through a center of the drop 1220, for example, in any of an X-, Y-, or Z-direction, or any rotational direction through the center of the drops 1220). In FIG. 14, a plurality of adjacent drops 1220 that form the pillar 1400 are laterally offset from each other such that the pillar 1400 gradually bends and forms an arc 1414.

FIG. 14 further depicts a second type Y of pillar 1402 includes a plurality of drops 1220 that are laterally offset from each other. FIG. 14 depicts a third vertical axis $A_3$ that extends through a center of a first drop 1420 of the pillar 1402, where the first drop 1420 physically contacts the surface 140 of the print substrate 100. FIG. 14 further depicts a fourth vertical axis $A_4$ that extends through a center of a second drop 1422 of the pillar 1402, where the second drop 1422 physically contacts a product such as a printed cap 402 (FIG. 4, not depicted for simplicity). The pillar 1402 can include additional drops 1220 positioned between the first drop 1420 and the second drop 1422. The third axis $A_3$, which extends through a center of several drops 1220, is laterally offset from the fourth axis $A_4$, which may also extend through a center of several drops 1220, by a distance $D_2$. In one aspect, the distance $D_2$ can be from about 10 μm to about 560 μm. In another aspect the distance $D_2$ can be from about 0.2 times to about 0.8 times a mean or target diameter of the drops 1220. In FIG. 14, only two adjacent drops 1220 that form the pillar 1400 are laterally offset from each other. Each of the drops 1220 that form the pillar 1402 are vertically aligned in only one of the two axes $A_3$ and $A_4$.

Either of the pillars 1400, 1402 includes drops 1220 that are laterally offset from each other. The lateral offset mitigates separation from the product by placing a greater stress at the location(s) of the lateral offset during separation than if the columns are vertically aligned along only a single axis. It will be appreciated that lateral offsets other than those depicted and described are contemplated and within the scope of the present teachings.

It will be appreciated that a method in accordance with an implementation of the present teachings can optionally include other processing acts not described herein for simplicity including, for example, a heating process (e.g., a re-melting process, a tempering process, etc.), an etching process (e.g., a chemical etch, a mechanical etch, etc.), a coating process (e.g., a metal plating process, a polymer coating process, etc.), or another process.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a three dimensional printed structure, the printed structure comprising a plurality of pillars at a plurality of pillar locations, the method comprising: ejecting only a first drop of a print material sequentially at each of the plurality of pillar locations from a print head; then ejecting only a second drop of the print material sequentially onto the first drop at each of the plurality of pillar locations from the print head; then ejecting additional drops of the print material sequentially at two or more of the pillar locations to form the plurality of pillars; then printing the plurality of pillars such that each pillar of the plurality of pillars, when completed, has a height and the height of each pillar of the plurality of pillars varies by no more than one drop diameter from the height of every other pillar of the plurality of pillars; printing the three dimensional printed structure to include a three dimensional printed product and a sacrificial support structure; wherein the sacrificial support structure comprises pillars that include: a base comprising a first plurality of levels, wherein each level of the first plurality of levels comprises at least two drops of the print material, wherein the at least two drops physically contact each other; and a breakaway comprising a second plurality of levels, wherein each level of the second plurality of levels comprises only one drop of the print material and forms a physically weaker contact point between the first plurality of levels and the three dimensional printed structure; then depositing drops sequentially at the plurality of pillar locations of the plurality of pillars onto a surface of a substrate and completing a formation of the plurality of pillars; then depositing a plurality of drops between adjacent pillars of the plurality of pillars sequentially to form a support surface that is generally parallel to the surface of the substrate; and wherein: the print material comprises metal; the plurality of drops deposited between adjacent pillars of the plurality of pillars are suspended between the adjacent pillars; and the plurality of drops deposited between adjacent pillars of the plurality of pillars do not physically contact the surface of the substrate or any drops below.

2. The method of claim 1, further comprising curing each drop while ejecting drops at other pillar locations from the print head.

3. The method of claim 1, further comprising ejecting the additional drops sequentially at the plurality of pillar locations from the print head onto a substrate to form the support surface such that the support surface, when completed, forms an angle of from 0° to 10° with respect to a plane of a surface of the substrate.

4. The method of claim 1, wherein the ejecting of only the first drop at each of the plurality of pillar locations and the ejecting of only the second drop at the plurality of pillar locations includes ejecting drops comprising at least one of copper, aluminum, lead, tin, and titanium from the print head.

5. The method of claim 1, wherein the ejecting of the print material comprises ejecting liquid metal.

6. The method of claim 1, wherein:
the print head follows a print path during the ejecting of only the first drop at each of the plurality of pillar locations;
the print head repeats the print path during the ejecting of only the second drop at each of the plurality of pillar locations; and
the print head repeats the print path during the ejecting of the additional drops sequentially at the two or more of the pillar locations to form the plurality of pillars.

7. The method of claim 1, further comprising printing a printed cap overlying, and physically contacting, the plurality of pillars, wherein the plurality of pillars physically support the printed cap during the printing of the printed cap; and
removing the plurality of pillars from the printed structure subsequent to the printing of the printed cap.

8. The method of claim 7, further comprising printing a plurality of walls using the print head prior to the printing of the printed cap, wherein the printed cap overlies, and physically contacts, the plurality of walls.

9. The method of claim 1, wherein:
each level of the first plurality of levels comprises at least four drops of the print material; and
each drop in each of the first plurality of levels physically contacts at least one other drop in the same level and at least one other drop in a different level.

10. The method of claim 9, further comprising:
printing a printed cap overlying the base and the breakaway of each of the plurality of pillars, and physically contacting the breakaway of each of the plurality of pillars, wherein the plurality of pillars physically support the printed cap during the printing of the printed cap; and
separating the printed cap from each breakaway of each pillar of the plurality of pillars.

11. The method of claim 1, further comprising printing the plurality of pillars such that each pillar of the plurality of pillars, when completed, has a height and the height of a tallest pillar of the plurality of pillars is at least four times the height of a shortest pillar of the plurality of pillars.

12. The method of claim 11, further comprising:
depositing drops sequentially at every pillar location onto a surface of a substrate and completing a formation of the plurality of pillars; then
depositing a plurality of drops between adjacent pillars of the plurality of pillars sequentially to form a support surface that has a sloped surface that is oblique relative to a plane of the surface of the substrate.

13. The method of claim 12, wherein the plurality of drops deposited between adjacent pillars of the plurality of pillars are suspended between the adjacent pillars and do not physically contact the surface of the substrate.

14. The method of claim 13, wherein the plurality of drops deposited between adjacent pillars of the plurality of pillars forms a ramp that intersects the plane of the surface of the substrate at an angle of from 20° to 70°.

15. A method for forming a three dimensional printed product, comprising:
forming a sacrificial support structure using a method comprising:
ejecting only a first drop of a print material sequentially at each of a plurality of pillar locations from a print head;
curing each first drop; then
ejecting only a second drop of the print material sequentially onto the first drop at each of the plurality of pillar locations from the print head after curing each first drop;
curing each second drop; then
ejecting additional drops of the print material sequentially at two or more of the pillar locations to form a plurality of pillars after curing each second drop;
wherein the sacrificial support structure comprises:
a base comprising a first plurality of levels, wherein each level of the first plurality of levels comprises at least two drops of the print material, wherein the at least two drops physically contact each other; and
a breakaway comprising a second plurality of levels, wherein each level of the second plurality of levels comprises only one drop of the print material and forms a physically weaker contact point between the first plurality of levels and the three dimensional printed product;
forming the three dimensional printed product using a method comprising ejecting a plurality of third drops onto a plurality of fourth drops while the plurality of fourth drops are uncured; and
physically separating the sacrificial support structure from the three dimensional printed product via a contact point between the sacrificial support structure and the three dimensional printed product.

16. A method for forming a three dimensional printed structure, the printed structure comprising a plurality of pillars at a plurality of pillar locations, the method comprising: ejecting only a first drop of a print material sequentially at each of the plurality of pillar locations from a print head onto a surface of a substrate to form a first printed layer; then ejecting only a second drop of the print material sequentially onto the first drop at each of the plurality of pillar locations from the print head to form a second printed layer on the first printed layer, where each second drop is vertically aligned with one of the first drops; then ejecting additional drops of the print material sequentially at two or more of the pillar locations, where each additional drop is vertically aligned with one of the second drops; printing a plurality of drops that are laterally offset from the additional drops to form a plurality of lateral supports, wherein each lateral support bridges two adjacent pillars and the plurality of drops do not physically contact the surface of the substrate or any drops below, wherein the three dimensional printed structure comprises a three dimensional printed product and a sacrificial support structure; and physically separating one or more of the plurality of pillars from the three dimensional printed product via a contact point between the sacrificial support structure and the three dimensional printed product.

* * * * *